United States Patent [19]

Hawkes

[11] Patent Number: 5,140,287
[45] Date of Patent: Aug. 18, 1992

[54] DIODE CIRCUIT FLICKER-NOISE REDUCTION

[75] Inventor: Henry W. Hawkes, Gloucester, England

[73] Assignee: The Secretary of State for Defence in Her Britannic Majesty's Government of the United Kingdom of Great Britain and Northern Ireland, London, England

[21] Appl. No.: 678,988
[22] PCT Filed: Nov. 2, 1989
[86] PCT No.: PCT/GB89/01311
§ 371 Date: Apr. 30, 1991
§ 102(e) Date: Apr. 30, 1991
[87] PCT Pub. No.: WO90/05408
PCT Pub. Date: May 17, 1990

[30] Foreign Application Priority Data
Nov. 2, 1988 [GB] United Kingdom ............... 8825619

[51] Int. Cl.$^5$ ............... H03C 3/00; H03K 5/00
[52] U.S. Cl. ............... 332/123; 332/136; 331/177 V; 307/503; 307/565
[58] Field of Search ............... 332/123, 136; 331/177 R, 177 V; 330/293, 294, 302; 307/503, 540, 551, 559, 561, 565

[56] References Cited

U.S. PATENT DOCUMENTS

| | | | |
|---|---|---|---|
| 3,569,866 | 3/1971 | Hearn | 332/136 |
| 3,671,884 | 6/1972 | Denny, Jr. | 332/136 X |
| 4,490,681 | 12/1984 | Turner | 307/354 X |
| 4,503,402 | 3/1985 | Englund, Jr. | 332/136 X |

FOREIGN PATENT DOCUMENTS 2261427  6/1974  Fed. Rep. of Germany.

OTHER PUBLICATIONS

Hampel et al., "Hochlinearer, breitbandiger Prazisions-Hf-Demodulator", vol. 31, no. 2, Jan. 29, 1982, Munchen DE pp. 57-59, Elektronik.

Turner, Electronics, "Schottky diode pair makes an rf detector stable", vol. 47, no. 9, May 2, 1974, pp. 94-95.

Primary Examiner—Robert J. Pascal
Attorney, Agent, or Firm—Nixon & Vanderhye

[57] ABSTRACT

A diode circuit in which the flicker noise generated by the diode is reduced comprises a diode (D1) connected in series with a resistor (R2) having a by-pass capacitor (C1) in parallel therewith. In one embodiment the side of the diode remote from this resistor (R2) is connected to one input of a DC differential inverting amplifier (A1) via a low pass filter (L1, C2). The amplifier's output is negatively fed back to the junction of the diode (D1) and the resistor (R2) so that the latter forms the amplifier load. A control voltage is applied to the other input of the amplifier of such value as to produce the required diode bias. The basic diode circuit can be extended to perform functions such as amplitude limiting, frequency control and modulation.

8 Claims, 2 Drawing Sheets

DIODE CIRCUIT FLICKER-NOISE REDUCTION

BACKGROUND OF THE INVENTION

1. Field of the Invention

This invention relates to the reduction of flicker noise in diode circuits, including varactor diode circuits. It has applications, for example, in diode amplitude-limiting circuits (sometimes termed limiter or clipper circuits), in modulating circuits, in modulation-enhancement circuits, and in varactor diode circuits for varying the frequency of tuned circuits. 2. Discussion of Prior Art Diode limiters have threshold levels below or beyond which the transfer characteristic between input and output changes relatively suddenly. This threshold level would ideally be defined by a reference voltage but, due to the nature of the required non-linearity, it exhibits flicker-noise effects or, more generally, a higher level of low-frequency noise than would be expected from purely resistive-thermal considerations. Such noise produces unwanted modulation of the output. Varactor diodes do not have a sharp threshold level, but are operated in regions where non-linear effects produce flicker noise; this results in flicker-noise-frequency noise-modulation of any voltage-controlled oscillator (VCO) controlled by the varactor. The present invention provides diode circuits is which this unwanted noise modulation is reduced.

SUMMARY OF THE INVENTION

The present invention consists of a diode circuit characterized in that it comprises:

a diode connected in series with a bias resistor having a by-pass capacitor connected in parallel therewith;

an inverting amplifier having an input which is connected to the side of the diode remote from said bias resistor;

a negative feedback connection from the inverting amplifier output to the junction of said diode and said bias resistor whereby said bias resistor forms the load of said inverting amplifier;

a low-pass filter in the connections between said diode and said inverting amplifier for excluding higher frequencies from the inverting amplifier;

and means for applying a bias voltage across the diode;

whereby the flicker-type noise contributed by the diode when in use is reduced.

The inverting amplifier is preferably a DC differential amplifier having said diode connected to one input thereof and means for applying a control voltage to the other input thereof whereby the control voltage determines the bias voltage on the diode.

An amplitude-limiting circuit according to the present invention comprises a diode circuit as aforesaid having a series input resistor connected to the side of the diode remote from said bias resistor, said input resistor having a resistance which is large compared with that of the series resistance of the diode when conducting plus the resistance of said bias resistor.

A frequency-control circuit according to the present invention comprises a diode circuit as aforesaid wherein said diode is a varactor diode and wherein said low-pass filter is connected between said diode and the input of the amplifier.

A modulating circuit according to the present invention comprises a frequency-control circuit as aforesaid wherein a further low-pass filter is included in the connections between said diode and said amplifier to prevent negative feedback of the modulating frequency.

BRIEF DESCRIPTION OF THE DRAWINGS

The present invention will now be described, by way of example, with reference to the accompanying drawings wherein.

DETAILED DISCUSSION OF PREFERRED EMBODIMENTS

Figure 1:
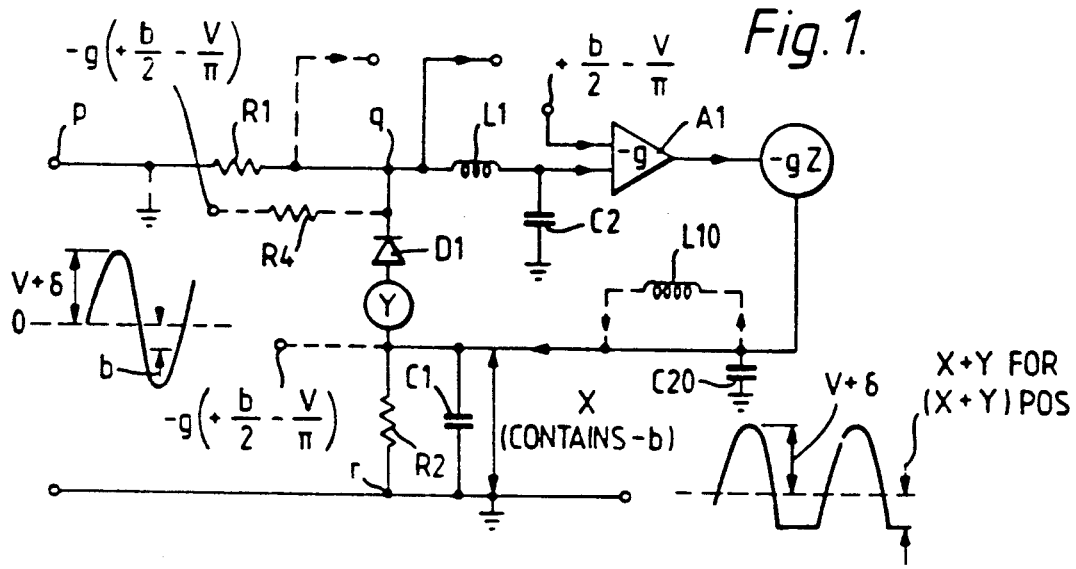
FIG. 1 is a circuit diagram of a diode limiter embodying the present invention.

In the limiter of FIG. 1, the input is an AC voltage of peak amplitude $V+\delta$, where $\delta$ is an amplitude modulation on a sinusoid of peak amplitude V. It is fed from a low-impedance source (from both the AC and DC aspects, not shown), to a resistor R1 connected in series with a diode D1 and a bias resistor R2. In parallel with R2 is a capacitor C1 which by-passes the AC input frequencies but not the flicker-noise frequencies. R1 is much larger than both the source impedance, e.g. a transformer secondary winding, and that of D1 (when conducting)+R2. In a conventional limiter a bias voltage of, say, $-b$ is applied to the junction of D1 and R2 as shown, and the effect is to clamp the negative-going half of the input waveform at the $-b$ level, i.e., the output waveform taken between points q and r is the input waveform as modified by the interrupted line. Y represents a source of flicker-type noise within the diode, so that the total peak-to-peak voltage of the output, $V+\delta+b$, is modulated by this noise.

In the present invention, the bias is not applied directly to the junction of D1 and R2. Instead, this junction is connected to the output of a differential DC inverting amplifier A1 of gain $-g$ and having a flicker-type noise level of gZ referred to the amplifier output. One input terminal of A1 is connected to the junction of R1 and D1 (point q) via a low-pass filter comprising inductor L1 and capacitor C2 which passes the flicker-type noise frequencies but stops the AC sinusoidal input frequencies $\omega$, $\omega 2$ etc. The other input terminal is connected to a control voltage $(+b/2-V/\pi)$. In effect A1 forms part of a negative feedback loop which reduces any low-frequency signals across points q,r and thus minimizes consequent modulation by such noise created in D1. Suitably g has a value of 10–20 (20 dB–26 dB).

Figure 1A:
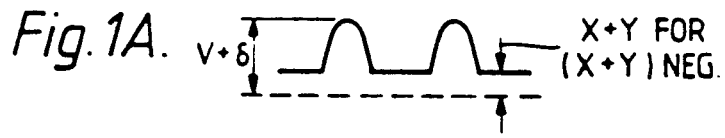
FIG. 1a shows a waveform across part of the circuit of FIG. 1.

The detailed operation of the circuit is as follows. Assuming an input voltage across p,r of $(V+\delta)\sin\omega t$, where $\delta$ is a modulation inherent in the input, then with an effective bias of X on D1 as shown, the $\omega$-based output q,r has a peak-to-peak value of $$(V+\delta-\overline{X+Y}) \qquad (1)$$

as shown by the two waveforms in FIG. 1A, for $(X+Y)$ positive and $(X+Y)$ negative respectively.

The low-frequency (LF) signal amplitude across q,r (i.e. a detected version of (1)) is $$\frac{V+\delta}{\pi} + \frac{(X+Y)}{2} \quad (2)$$

Multiplication of (2) by $-g$ gives $$X = -g\left[\frac{V+\delta}{\pi} + \frac{(X+Y)}{2} - \frac{V}{\pi} + \frac{b}{2} + Z\right]$$

where the control voltage $(+b/2 - V/\pi)$ produces an effective bias of $-b$ as before as will be seen, the $-V/\pi$ term cancelling the relatively large detected DC value of V, whence $$X + Y \approx -\frac{2\delta}{\pi} + \frac{4\delta}{\pi g} + \frac{2Y}{g} - 2Z - b \quad (3)$$

in which $-b$ is the bias.

Substitution of (3) in (2) gives $$LF \text{ signal amplitude} = \frac{V}{\pi} + \frac{2\delta}{\pi g} + \frac{Y}{g} - Z + \frac{b}{2} \quad (4)$$

i.e., all the LF signals have been reduced by g, although the flicker-type noise Z from the amplifier has been added.

Equation (1) can be rewritten as $$V + \delta - X - Y \approx V + \delta\left(1 + \frac{2}{\pi}\right) - \frac{4\delta}{\pi g} - \frac{2Y}{g} + 2Z + b \quad (5)$$

whereas the corresponding peak-to-peak -based signal across p,q is $$2V + 2\delta - (V + \delta - X - Y) = V + \delta\left(1 - \frac{2}{\pi}\right) + \frac{4\delta}{\pi g} + \frac{2Y}{g} - 2Z - b \quad (6)$$

If the input voltage is a square wave of fundamental frequency $\omega/2\pi$, then with a control voltage of $+V/2 - V/2$ it can be shown by a similar analysis that $$X + Y \approx -\delta + \frac{2\delta}{g} + \frac{2Y}{g} - 2Z - b \quad (7), \text{cf}(3)$$

The peak AC $\omega$-based voltage across q,r $$= V + 2\delta - \frac{2\delta}{g} - \frac{2Y}{g} + 2Z + b. \quad (8), \text{cf}(5)$$

and the AC $\omega$-based voltage across p,q $$= V + \frac{2\delta}{g} + \frac{2Y}{g} - 2Z - b. \quad (9), \text{cf}(6)$$

If the polarity of D1 is reversed in order to limit the positive-going half of the wave, the signs of both terms of the control voltage are also reversed, i.e., to $-b/2 + V/\pi$.

In practice the circuit is set up by adjusting the control voltage to amplifier A1 until the desired diode bias is obtained across R2, enabling the diode to operate within its dynamic range, i.e., it is not necessary actually to quantify the two terms of the control voltage.

Although the circuit reduces the flicker-type noise arising from the diode, as seen it adds the similar noise generated in the amplifier. However, at flicker-noise frequencies, i.e., below about 10 kHz, the amplifier noise will normally be much lower than the diode noise. If the dominant noise is thermal noise, i.e., above about 10 kHz, the circuit is hardly useful, because one is then merely exchanging diode thermal noise for amplifier thermal noise.

The amplifier A1 should have a bandwidth covering the flicker-noise spectrum and extending to near DC and is preferably a DC amplifier, though this is not essential. Nor need the control voltage which provides the diode bias $-b$ be introduced as a second input to the amplifier as shown, i.e., A1 need not be a differential amplifier, though this also is preferred. Instead, a bias of $-g(+b/2 - V/\pi)$ can be applied directly to the junction of D1 and R2 (see interrupted-line connection) provided the bias source is of sufficiently high impedance not to shunt R2, which is in effect the amplifier load. Alternatively, with a low-impedance bias source, the bias can be applied to a low-value resistor (not shown) connected in series with R2 to earth, or via a high-value resistor R4 to the junction of D1 and R1 (see interrupted-line connection).

Some further applications of the invention will now be described.

Limiting

If an amplitude-modulated signal is fed into a conventional bipolar limiter, i.e., comprising two oppositely-poled, oppositely-biased diodes connected in parallel and having a common feed resistor (corresponding to R1 in FIG. 1), the output across the diodes (corresponding to q,r in FIG. 1) is a square-wave having a residual modulation which may be greatly reduced by the limiting level. For example, an initial modulation level is reduced to residuals of 24 dB and 70 dB down for limiting levels of 6 dB and 20 dB down respectively. This residual modulation, however, has added to it the flicker and excess thermal noise at the limiting level used. Assuming this noise level is independent of limiting level, then the modulation due to noise is accentuated proportionately to the residual modulation at low limiting levels, which of themselves reduce the residual modulation level.

The performance of the above known arrangement can be improved by feeding the above square-wave to a limiter consisting of a single FIG. 1 circuit, and taking the final output across p,q. This output can be obtained by transferring the ground point from the lower end of R2 to p and taking the output from q, as shown by the interrupted lines. The input is now applied, in effect, at point r. The filter L1,C2 is moved from the input of the amplifier A1 to its output, as shown at L20,C20, in order to exclude the AC input frequency, present at r, from the amplifier. Alternatively, the ground point can remain at r and the output across R1 taken via a differential amplifier (not shown), provided the latter is of a design which does not re-introduce more flicker noise, e.g., as described in GB Patent Application 825617.7.

The limited output is now given by equation (9), in which the residual modulation, i.e., the original residual modulation plus the flicker-noise of the preceding conventional limiter, and the flicker-noise modulation of the diode D1 in the present limiter, are reduced by factors of $g/2$. The only other noise modulation is that produced by the amplifier A1, which will not greatly exceed thermal-noise levels except at very low flicker-noise frequencies. The net trade-off is the virtual elimination of diode flicker-noise effects for an increase in normal thermal noise levels which equate to 6 dB plus the amplifier noise figure, because of the 2Z term in equation (5).

The limited waveform produced by the above arrangement is unipolar in nature. A similar circuit can be used to obtain the other polarity, i.e., by reversing the diode and making the control voltage $-b/2+V/\pi$. The advantage of the bipolar arrangement is that the two outputs can be added to double the amplitude of the output. In this case, moreover, the noise produced by the two amplifiers required adds in a random manner, as mentioned later in relation to FIG. 3, giving an improvement of 3 dB in amplifier noise. The addition of the two separate p,q outputs can be by capacitor connections from the points q to the ends of a center-earthed transformer primary winding, as in FIG. 3.

The same improvement is not obtained if the original modulated AC input is fed directly to one or two FIG. 1 circuits for squaring, because the output is then given by equations (5) or (6) instead of equation (9).

Modulation enhancement

In Patent Application GB 2213666A there is disclosed a circuit for enhancing the modulation depth of an amplitude-modulated signal. FIG. 1 thereof includes a limiter-slicer 1 comprising a pair of oppositely-poled and oppositely-biased diodes connected in parallel and in series with a common output resistor, the input being applied to the interconnected ends of their two by-passed series bias resistors remote from the diodes. The effect is to remove the main bulk of a lightly-modulated input waveform, leaving only the tips of both polarities, which are summed across the output resistor to produce an enhanced modulation level upon a much-reduced absolute carrier level. This reduced level is, however, modulated by the flicker-noise of the two diodes, which may be significant at the low frequencies of the flicker-noise spectrum.

Figure 2:
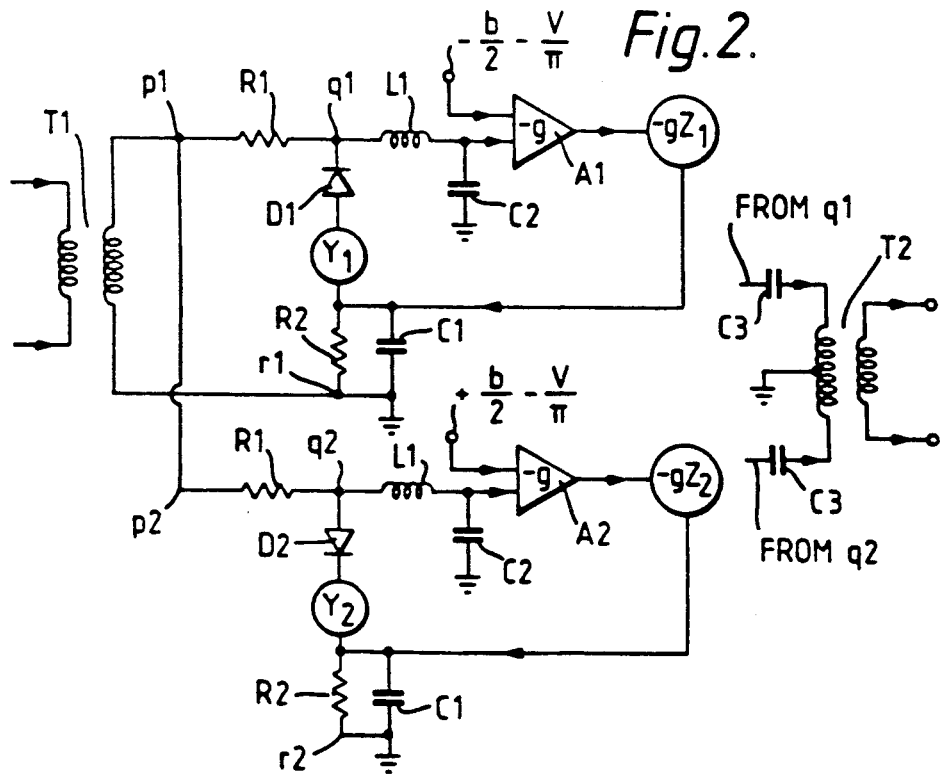
FIG. 2 is a circuit diagram of a modulation enhancement circuit embodying the present invention.

An improved arrangement using the present invention is shown in FIG. 2, which includes two modified versions of the limiters of FIG. 1. The two limiters are conveniently fed from one end of the secondary winding of a transformer T1 (though this is not essential provided the alternative source has low AC and DC impedance) to whose primary winding the lightly modulated input signal is fed. In the upper limiter D1 is poled as in FIG. 1 but the bias term of the control voltage to amplifier A1 is reversed to become $-b/2$. In the lower limiter D1 is reversed and the bias term for amplifier A2 is $+b/2$, while the second term, becomes $+V/\pi$. The two outputs, of opposite polarity, are taken from points q1 and q2 via capacitors C3 to the ends of a center-grounded primary winding of a transformer T2, from whose secondary winding the summed output is obtained.

The reversed bias element in the upper limiter causes only the tip of the positive-going half of the input waveform above the bias level $+b$ to appear as its output. Similarly only the tip of the negative-going half of the input waveform below the bias level $-b$ appears as the output of the lower limiter.

Because the biases are reversed as compared with FIG. 1, b must be reversed in equation (5), which represents both the positive- and negative-going halves of the output waveform. Hence the output of FIG. 2 is:

$$(V - b) + \delta\left(1 + \frac{2}{\pi}\right) - \frac{4\delta}{\pi g} - \frac{2Y_1}{g} + 2Z_1$$

for the positive-going half of the output waveform, and $$(V - b) + \delta\left(1 + \frac{2}{\pi}\right) - \frac{4\delta}{\pi g} - \frac{2Y_2}{g} + 2Z_2$$

for the negative-going half of the output waveform.

The net result is an interchange of the flicker-noises ($Y_1$ and $Y_2$) of the diodes D1,D2 for the flicker-noises ($Z_1$ and $Z_2$) of the amplifiers A1,A2. This interchange is advantageous when the flicker-noise of the diodes exceeds that of the amplifiers and where the greater thermal noise introduced by the amplifiers as compared with the diodes is not significant. A further, minor, advantage over the circuit shown in the aforesaid Application is that the output is taken across a common ground point (the center tapping of T2 primary winding) rather than across the series resistor R3 therein.

Modulation or Amplitude-Control

Figure 3:
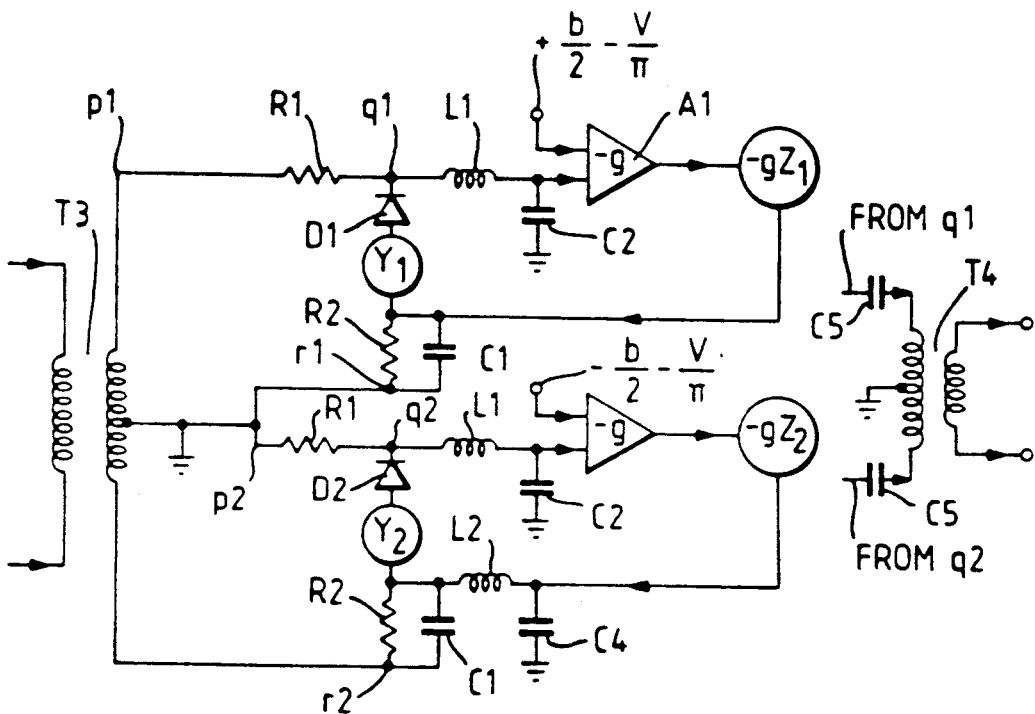
FIG. 3 is a circuit diagram of a modulator embodying the present invention.

In the preceding description, b has been assumed to be a DC voltage, but a variable b can be used to produce a variable-amplitude or modulated version of an original AC input; FIG. 3 shows a suitable circuit. In FIG. 3, two anti-phase inputs are conveniently obtained from a transformer T3 having a center-grounded secondary winding; alternatively a phase-splitter or equivalent circuit of sufficiently low AC and DC internal impedance may be used.

An upper diode circuit similar to FIG. 1 is connected between one end of T3 secondary winding and its center tap with its resistor R1 connected to that end, and a lower diode circuit similar to FIG. 1 is connected between the center tap and the other end of T3 secondary winding with its resistor R1 connected to the center tap, i.e., to ground. In this circuit both diodes D1 are poled in the same direction and hence the polarity of the $V/\pi$ term is the same, viz negative, in both control voltages. The $b/2$ term, i.e., the modulating term, is applied in anti-phase to the respective circuits, the polarities shown in FIG. 3 being instantaneous ones.

The combined output is taken from points q1 and q2 via capacitors C5 to the ends of center-grounded primary winding of a transformer T4, from whose secondary winding the final modulated or variable-amplitude output is obtained. This combined output across q1, q2 is given by equation (5)+equation (6) and becomes $$2V + 2\delta + 2b + 2\frac{\sqrt{Y_1^2 + Y_2^2}}{g} + 2\sqrt{Z_1^2 + Z_2^2}$$

i.e., in effect the amplitude V is increased by b, where the two separate pairs of noise sources are combined in an RMS manner as suited to their random origins. When the polarities of the two applied b/2 voltages are reversed, the $+2b$ term in the above expression becomes $-2b$, i.e., V is decreased by b. As in FIG. 2 there is a trade-off of the flicker noise from the diodes for low flicker noise from the amplifiers. The term b can be used to modulate at frequencies comparable to or greater than δ. If the frequency of b is much less than δ the circuit can be regarded as an amplitude controller. If the frequency of b is made equal to δ, the circuit can be used to remove all the modulation.

Because the lower end of T3 secondary winding is live at the AC input frequency, a low-pass filter L2,C4 is included in the feedback connection from A2 to D2 to exclude this frequency from the amplifier (compare L10,C20 in FIG. 1). The retention of the L2,C2 filter at the input to A2 may be found unnecessary but may still be desirable.

Any harmonics of the AC input frequency introduced by the amplitude-limiting action of the diodes can be filtered-out subsequently.

VARACTOR MODULATOR OR FREQUENCY-CONTROLLER

Figure 4:
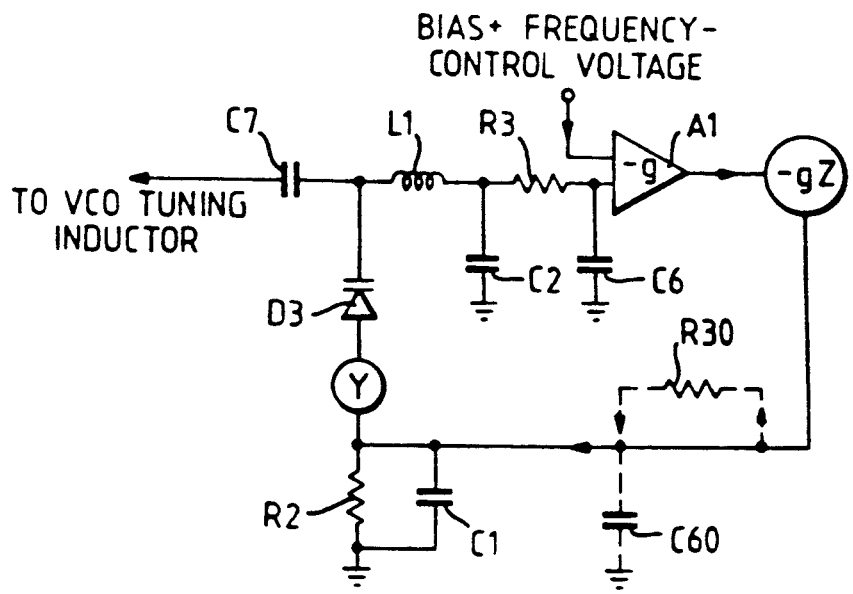
FIG. 4 is a circuit diagram of a varactor circuit embodying the present invention.

FIG. 4 shows an arrangement for the varactor modulation of a voltage-controlled oscillator (VCO). The circuit is similar to FIG. 1 except that the diode D1 is replaced by a varactor D3 connected to the VCO tuning inductor (not shown) via a blocking capacitor C7 which prevents the bias applied to D3 being short-circuited. The variable frequency-modulating voltage, together with the varactor standing bias, are applied to the control-voltage input terminal of amplifier A1 or alternatively across R2,C1 or across the diode itself, as in FIG. 1. Additionally, a low-pass resistor-capacitor filter R3,C6 is connected between the L1,C2 filter and the amplifier input to prevent negative feedback of the modulating-frequency voltage across the varactor, assuming the modulating frequency to be above the flicker-noise frequencies so that the latter are not stopped. This filter can alternatively be connected in the amplifier output, as shown at R30,C60, or may be omitted altogether and a modulating signal of g×(required modulating voltage across D3) applied as the control-voltage input to A1. The latter is only practicable where the required modulating voltage is not too large. For slow, e.g., manual, changes of frequency-control voltage, this filter can also be omitted.

The net effect, as in FIG. 1 and as shown by equation (4), is to reduce all unwanted (i.e., not the above modulating frequency) low-frequency signals across the varactor and thus to minimize unwanted frequency modulation by flicker noise. The level of thermal noise is determined by the low-frequency impedance between D3 and ground, which is normally kept low, e.g., by making C7 large, in order to minimize the thermal voltage across D3. The amplifier A1 increases this noise by a factor equal to 6 dB above the amplifier noise level (1-2 dB) because of the 2Z term in equation (5). This disadvantage of the FIG. 4 circuit compared with normal practice is usually justified by the greater potential reduction in the flicker-noise effect.

I claim:
1. A diode circuit characterized in that it comprises;
   a diode (D1) connected in series with a bias resistor (R2) having a by-pass capacitor (C1) connected in parallel therewith;
   an inverting amplifier (A1) having an input which is connected to the side of the diode (D1) remote from said bias resistor (R2);
   a negative feedback connection from the inverting amplifier output to the junction of said diode (D1) and said bias resistor (R2) whereby said bias resistor (R2) forms the load of said inverting amplifier (A1);
   a low-pass filter (L1, C2) in the connections between said diode (D2) and said inverting amplifier (A1) for excluding higher frequencies from the inverting amplifier (A1);
   and means for applying a bias voltage across the diode (D1);
   whereby the flicker-type noise contributed by the diode (D1) when in use is reduced.
2. A diode circuit as claimed in claim 1 wherein the inverting amplifier (A1) is a DC differential amplifier having said diode (D1) connected to one input thereof and means for applying a control voltage to the other input thereof whereby the control voltage determines the bias voltage on the diode (D1).
3. An amplitude-limiting circuit comprising a diode circuit as claimed in claim 1 having a series input resistor (R1) connected to the side of the diode (D1) remote from said bias resistor (R2).
4. A frequency-control circuit comprising a diode circuit as claimed in claim 1 wherein said diode is a varactor diode (D3) and wherein said low-pass filter (L1, C2) is connected between said diode (D3) and the input of the inverting amplifier (A1).
5. A modulating circuit comprising a frequency-control circuit as claimed in claim 4 wherein a further low-pass filter (R3, C6) is included in the connections between said diode (D3) and said inverting amplifier (A1) to prevent negative feedback of the modulating frequency.
6. An amplitude-limiting circuit comprising a diode circuit as claimed in claim 2 having a series input resistor (R1) connected to the side of the diode (D1) remote from said bias resistor (R2).
7. A frequency-control circuit comprising a diode circuit as claimed in claim 2 wherein said diode is a varactor diode (D3) and wherein said low-pass filter (L1, C2) is connected between said diode (D3) and the input of the inverting amplifier (A1).
8. A modulating circuit comprising a frequency-control circuit as claimed in claim 7 wherein a further low-pass filter (R3, C6) is included in the connections between said diode (D3) and said inverting amplifier (A1) to prevent negative feedback of the modulating frequency.

* * * * *